United States Patent
Khaja et al.

(10) Patent No.: US 10,192,762 B2
(45) Date of Patent: Jan. 29, 2019

(54) SYSTEMS AND METHODS FOR DETECTING THE EXISTENCE OF ONE OR MORE ENVIRONMENTAL CONDITIONS WITHIN A SUBSTRATE PROCESSING SYSTEM

(71) Applicant: APPLIED MATERIALS, INC., Santa Clara, CA (US)

(72) Inventors: Fareen Adeni Khaja, San Jose, CA (US); David Mordo, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 307 days.

(21) Appl. No.: 15/048,258

(22) Filed: Feb. 19, 2016

(65) Prior Publication Data

US 2017/0213750 A1 Jul. 27, 2017

Related U.S. Application Data

(60) Provisional application No. 62/287,429, filed on Jan. 26, 2016.

(51) Int. Cl.
*H01L 21/677* (2006.01)
*H01L 21/67* (2006.01)
(Continued)

(52) U.S. Cl.
CPC ........ *H01L 21/67248* (2013.01); *B65G 43/00* (2013.01); *H01L 21/6773* (2013.01);
(Continued)

(58) Field of Classification Search
CPC .................................................. H01L 21/6773
(Continued)

(56) References Cited

U.S. PATENT DOCUMENTS 5,775,808 A  7/1998 Pan
6,536,370 B2 *  3/2003 Paton ................... G01N 31/222
116/206
(Continued)

FOREIGN PATENT DOCUMENTS

WO   WO 9859229 A2 *  12/1998   ....... H01L 21/67393

OTHER PUBLICATIONS

International Search Report and Written Opinion dated May 2, 2017 for PCT Application No. PCT/US2017/014842.
(Continued)

*Primary Examiner* — Clayton E LaBalle
*Assistant Examiner* — Leon W Rhodes, Jr.
(74) *Attorney, Agent, or Firm* — Moser Taboada; Alan Taboada

(57) ABSTRACT

Methods for operating a substrate processing cluster tool include positioning a substrate storage cassette within a factory interface of the substrate processing cluster tool, wherein the substrate storage cassette defines an interior volume dimensioned and arranged to receive one or more substrates, and sensing, by execution of stored instructions by a processor operatively associated with a plurality of sensors, at least one of occurrence of a condition of a plurality of conditions within the interior volume or persistence of a condition of the plurality of conditions within the interior volume. Responsive to the sensing, at least one of generating an alert or performing an alternate operation involving the substrate storage cassette.

18 Claims, 4 Drawing Sheets

(51) Int. Cl.
*B65G 43/00* (2006.01)
*H01L 21/673* (2006.01)

(52) U.S. Cl.
CPC .. *H01L 21/67288* (2013.01); *H01L 21/67389* (2013.01); *H01L 21/67393* (2013.01)

(58) Field of Classification Search
USPC .................................................. 206/710–712
See application file for complete search history.

(56) References Cited

U.S. PATENT DOCUMENTS

| | | | |
|---|---|---|---|
| 6,568,896 B2 | 5/2003 | Franklin et al. | |
| 7,155,915 B2* | 1/2007 | Shin | F25B 21/02 62/259.2 |
| 7,158,845 B2* | 1/2007 | Parsons | G05B 19/409 700/222 |
| 7,665,661 B2* | 2/2010 | Wang | G06Q 10/00 235/385 |
| 7,887,276 B2* | 2/2011 | Natume | B66F 11/00 414/217 |
| 8,206,076 B2* | 6/2012 | Ueda | H01L 21/67769 414/217 |
| 8,234,002 B2* | 7/2012 | Emoto | H04Q 9/00 141/1 |
| 8,821,099 B2* | 9/2014 | Hall | H01L 21/67775 118/500 |
| 8,972,029 B2* | 3/2015 | Pannese | G05B 15/02 700/14 |
| 2002/0187025 A1 | 12/2002 | Speasi et al. | |
| 2009/0053017 A1 | 2/2009 | Shmuelov | |
| 2009/0317214 A1* | 12/2009 | Hsiao | H01L 21/67017 414/217 |
| 2011/0114534 A1 | 5/2011 | Watson et al. | |
| 2012/0083918 A1 | 4/2012 | Yamazaki | |
| 2012/0135610 A1 | 5/2012 | Ide | |
| 2015/0228516 A1* | 8/2015 | Liao | H01L 21/67389 34/443 |
| 2017/0074727 A1* | 3/2017 | Liu | G01J 5/0007 |

OTHER PUBLICATIONS

Kamoshima, et al. "Ambient Gas Control in Slot-to-Slot Space Inside FOUP to Suppress Cu-Loss after Dual Damascene Patterning", ISSM Paper: PO-O-113, International Symposium on Semiconductor Manufacturing, 2007.

Fontaine, et al., "Study of the Volatile Organic Contaminants Absorption and their Reversible Outgassing by FOUPs", Solid State Phenomena, vols. 145-146 (2009), pp. 143-146.

Elizabeth Woolfenden (1997), "Monitoring VOCs in Air Using Sorbent Tubes Followed by Thermal Desorption-Capillary GC Analysis: Summary of Data and Practical Guidelines", Journ of the Air & Waste Management Assocation, 47:1, pp. 20-36.

Otto, et al., "Assessment of a FOUP Conditioning Equipment for Advanced Semiconductor Application", Solid State Phenomena, vol. 187 (2012) pp. 299-302.

Kuo, et al., "FOUP Environment Control and Condense Reduction", e-Manufacturing & Design Collaboration Symposium 2012.

Nicola Watson, "Analysis of TO-15/TO-17 Air Toxics in Urban Air Using TD-GC/TOF MS and Automated Compound Identification Software", NEMC, Washington D.C., Aug. 6, 2012.

Lv, et al., "Study of Solving the Outgas Induced Defect in Metal Hard Mask All-In-One Etch Process", ECS Transactions, 60(1), pp. 323-329 (2014).

Shimadzu Application Data Sheet No. 38, "Analysis of Automobile Cabin Air by Thermal Desorption GC-MS Using the OPTIC-4 Multimode Inlet".

"Thermal Desorption Tubes, Versatile Air Sampling for a Wide Range of Applications", RESTEK Lit. Cat. #EVFL 1065.

"Thermal Desorption Introduction and Principles", Agilent Technologies.

\* cited by examiner

SYSTEMS AND METHODS FOR DETECTING THE EXISTENCE OF ONE OR MORE ENVIRONMENTAL CONDITIONS WITHIN A SUBSTRATE PROCESSING SYSTEM

CROSS-REFERENCE TO RELATED APPLICATIONS

This application claims benefit of U.S. provisional patent application Ser. No. 62/287,429, filed Jan. 26, 2016, which is herein incorporated by reference in its entirety.

FIELD

Embodiments consistent with the present disclosure generally relate to methods and apparatus for maintaining environmental safety and avoiding cross-contamination between substrate processing chambers and/or other components of a cluster tool processing system.

BACKGROUND

Semiconductor substrate processing is typically performed by subjecting a substrate to a plurality of sequential processes to create devices, conductors and insulators on the substrate. These processes are generally performed in a process chamber configured to perform a single aspect of the production process. In order to efficiently perform an entire processing sequence, a number of process chambers are typically coupled to a central transfer chamber that houses a robot to facilitate transfer of the substrate between the surrounding process chambers. A semiconductor processing platform having such a configuration is generally known as a cluster tool, examples of which are the families of CENTURA® and ENDURA® processing platforms available from Applied Materials, Inc., of Santa Clara, Calif.

Generally, a cluster tool consists of a central transfer chamber having a robot disposed therein. The transfer chamber is generally surrounded by one or more process chambers and at least one load lock chamber to facilitate transfer of substrate containers or reticle pods into and out of a tool or to retrieve the substrate containers from a factory interface. The process chambers are generally utilized to process the substrate, for example, performing various processing operations such as etching, physical vapor deposition, chemical vapor deposition, ion implantation, lithography and the like.

Substrate containers and reticle pods generally are sealed storage cassettes known as FOUPs (front opening unified pods), FOSBs (front opening shipping boxes), or SMIF (standard mechanical interface) pods. These containers provide a microenvironment to isolate and control the environment surrounding wafers and substrates used in manufacturing integrated circuits, during storage, transport and processing of the materials.

The inventors herein have observed that residual gases may accumulate within the substrate storage cassettes and the factory interface of a cluster tool as the result, for example, of substrate outgassing. Outgassing from a substrate following processing by one tool may lead to cross contamination of one or more other tool(s) used in downstream processes. As well, such outgassing may compromise the health and safety of the personnel involved in the configuration, operation and/or maintenance of a cluster tool.

SUMMARY

Proposed herein are systems and methods for detecting and/or monitoring the existence of one or more process-affecting conditions such as those associated with or giving rise to the accumulation of contaminants by, for example, outgassing within a substrate storage cassette and/or the factory interface of a substrate processing cluster-tool.

In some embodiments, methods for operating a substrate processing cluster tool include positioning a substrate storage cassette within a factory interface of the substrate processing cluster tool, wherein the substrate storage cassette defines an interior volume dimensioned and arranged to receive one or more substrates, and sensing, by execution of stored instructions by a processor operatively associated with a plurality of sensors, an occurrence of a condition of a plurality of conditions within the interior volume or persistence or a condition of the plurality of conditions within the interior volume. Responsive to the sensing, the method comprises generating an alert or performing an alternate operation involving the substrate storage cassette.

In some embodiments, a substrate processing cluster tool comprises at least one tool comprising a substrate processing chamber; a factory interface defining a sealed interior cavity dimensioned and arranged to receive a plurality of substrate storage cassettes; at least one substrate storage cassette disposed within the interior cavity, each substrate storage cassette defining an interior volume dimensioned and arranged to receive one or more substrates; a plurality of sensors; and a processor operatively associated with the plurality of sensors and a memory containing instructions executable by the processor. The instructions are executable to sense an occurrence of a condition of a plurality of conditions within the interior volume or persistence of a condition of the plurality of conditions within the interior volume, and responsive to the sensing, to generate an alert or perform an alternate operation involving the substrate storage cassette.

In still other embodiments, a substrate storage cassette monitoring system for use with a substrate processing tool comprises at least one substrate storage cassette dimensioned and arranged for placement within an interior cavity of a factory interface of the substrate processing tool, wherein each substrate storage cassette defines an interior volume dimensioned and arranged to receive one or more substrates; a plurality of sensors; and a processor operatively associated with the plurality of sensors and a memory containing instructions executable by the processor to sense an occurrence of a condition of a plurality of conditions within the interior volume or persistence of a condition of the plurality of conditions within the interior volume; and responsive to the sensing, to generate an alert or to perform an alternate operation involving the substrate storage cassette.

Other and further embodiments consistent with the present disclosure are described below.

BRIEF DESCRIPTION OF THE DRAWINGS

So that the manner in which the above recited features of embodiments of the present disclosure can be understood in detail, a more particular description, briefly summarized above, may be had by reference to embodiments, some of which are illustrated in the appended drawings. However, the appended drawings illustrate only typical embodiments and are not to be considered limiting, for the disclosure may admit to other equally effective embodiments.

Figure 1:
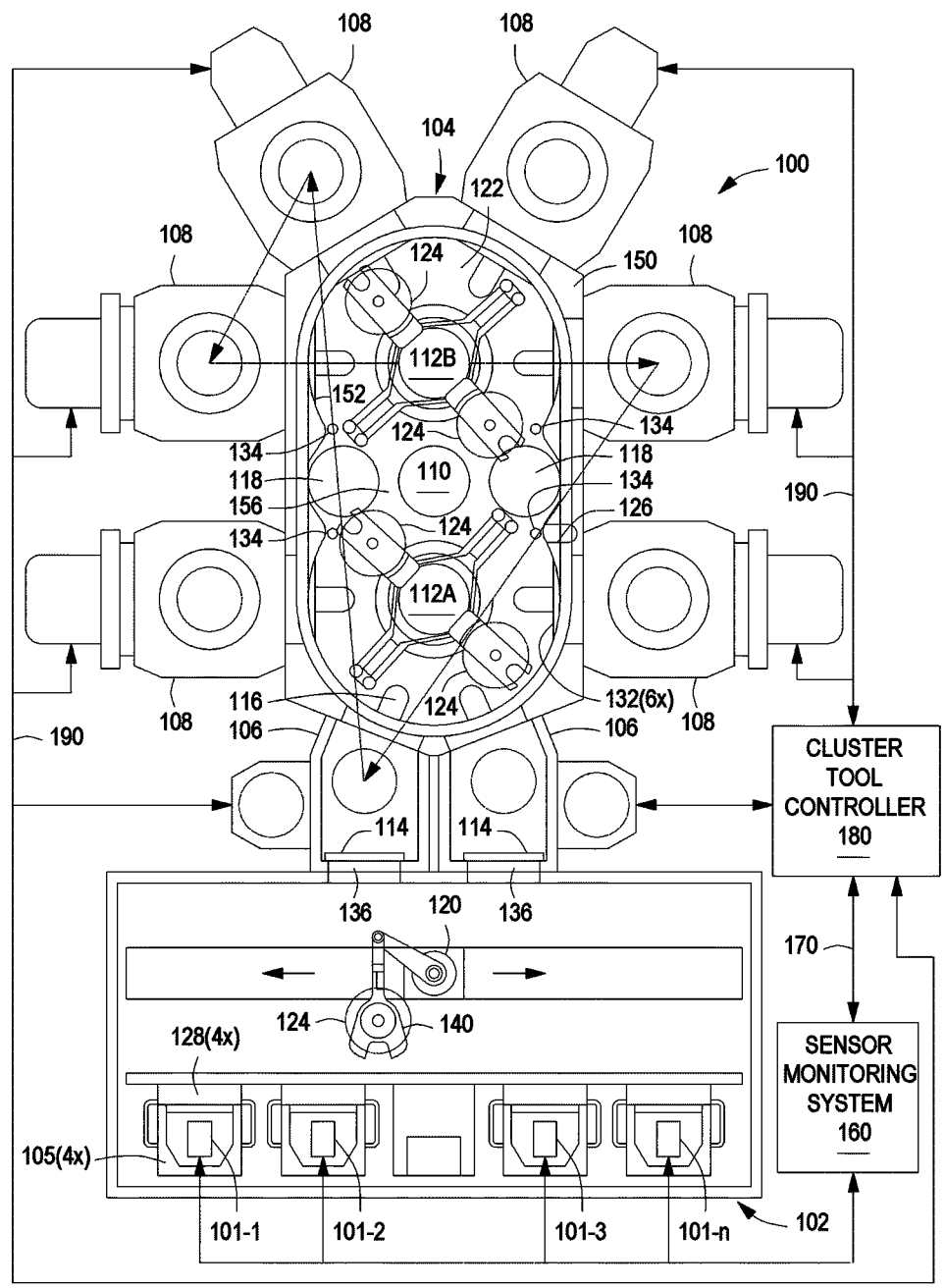
FIG. 1 depicts a plan view of a substrate processing system that includes, a factory interface, a distributed arrangement of sensors, and a monitoring system in accordance with one or more embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments consistent with the present disclosure include a system and method for real-time sensing and monitoring of conditions—within the substrate storage cassettes (e.g. FOUPs) and factory interface of a substrate processing cluster tool ("cluster tool")—which are indicative of, or are capable of promoting, cross contamination within the various process chambers of a cluster tool. The inventors herein have determined that sources of cross contamination such as substrate outgassing may deleteriously affect substrate processing operations as photolithographic patterning, film deposition, ion implantation, and plasma doping in a clean room. The contaminants accumulating within a substrate storage cassette and/or a factory interface may be organic (e.g., photo resist compounds and solvents) or inorganic (e.g., acid/base vapors, dopants, etc.).

According to embodiments consistent with the present disclosure, an arrangement of sensors is used to directly measure and/or to estimate the concentration of such contaminants, and/or to monitor for the existence and/or persistence of environmental conditions promoting the accumulation of such contaminants. In embodiments, at least some of the sensors are wireless linked to a monitoring system which is coupled to a controller able to suspend and/or terminate such operations of a cluster tool as may be appropriate to prevent cross-tool contamination and/or injury to personnel responsible for configuring, operating or maintaining the cluster tool. In some embodiments, a plurality of sensors are disposed within a sealable interior cavity or chamber of one or more substrate storage cassettes and, optionally, the factory interface of a cluster tool. In some embodiments, one or more sensors are disposed on or within an exterior wall (e.g., a sidewall, top wall, or bottom wall) of one or more substrate storage cassettes.

Various embodiments of systems and methods for dynamically controlling the operation of a substrate processing cluster tool based on real time sensing and monitoring of conditions within substrate storage cassettes and an associated factory interface described below. In the following detailed description, numerous specific details are set forth to provide a thorough understanding of the claimed subject matter. However, such details are for ease of illustration, the claimed subject matter may be practiced without such specific details. In other instances, methods, apparatuses or systems that would be known by one of ordinary skill have not been described in detail so as not to obscure claimed subject matter.

Some portions of the detailed description which follow are presented in terms of operations on binary digital signals stored within a memory of a specific apparatus or dedicated purpose computing device or platform. In the context of the present disclosure, the term specific apparatus or the like includes a general purpose computer once such computer has been programmed to perform particular functions pursuant to instructions from program software. In the context of the present disclosure, operations or processing involve physical manipulation of physical quantities. Typically, although not necessarily, such quantities may take the form of electrical or magnetic signals capable of being stored, transferred, combined, compared or otherwise manipulated. For convenience and/or to remain consistent with common usage, such signals may be referred to herein as bits, data, values, elements, symbols, characters, terms, numbers, numerals or the like. Any of these or similar terms, however, are to be associated with appropriate physical quantities and are merely convenient labels. Unless specifically stated otherwise, as apparent from the following discussion, discussions utilizing terms such as "processing," "computing," "calculating," "determining" or the like may be understood to refer to actions or processes of a specific apparatus, such as a dedicated purpose computer or a similar dedicated purpose electronic computing device. In the context of the present disclosure, a dedicated purpose computer or a similar dedicated purpose electronic computing device is capable of manipulating or transforming signals, typically represented as physical electronic or magnetic quantities within memories, registers, or other information storage devices, transmission devices, or display devices of the dedicated purpose computer or similar dedicated purpose electronic computing device.

FIG. 1 depicts a plan view of a cluster tool 100 for processing many substrates simultaneously. The cluster tool 100 includes a distributed arrangement of sensors indicated at 101-1, 101-2, 101-3, and 101-n (collectively, 101), a factory interface 102, and a monitoring system 103, in accordance with one or more embodiments of the present disclosure. The cluster tool 100 further includes a transfer chamber 104, a plurality of substrate storage cassettes 105 (e.g., FOUPs), one or more load lock chambers 106, and a plurality of process chambers 108.

One or more sensors 101-1 to 101-n, or other metrology devices are disposed within an interior cavity of each substrate storage cassette 105. At least some of the one or more sensors 101-1 to 101-n may be arranged within the interior cavity so that they are aligned with one or more inspection windows defined within each substrate storage cassette 105. In some embodiments, one or more of the sensors 101-1 to 101-n are disposed on or within an exterior sidewall, a top wall and/or a bottom wall of the substrate storage cassettes 105. The sensors may comprise temperature sensors, RGA sensors, baratron sensors, convectron sensors or other sensors utilized to detect attributes of the environment disposed within the substrate storage cassettes and, in some embodiments, the factory interface as well. In some embodiments, a macro controller associated with one or more substrate storage cassettes collects the output of each or a subset of sensors 101-1 to 101-n and transmits the output, at appropriate intervals, for processing by sensor monitoring system 160.

In embodiment, those of sensors 101-1 to 101-n disposed within the interior volume of each substrate storage cassette 105 is disposed in a recess so as to provide isolation and prevent contact by objects, for example, during transfer into and out of the interior volume of a substrate storage cassette 105. The transfer chamber 104 generally includes one or more passage(s) 126 disposed therein that may be utilized to provide one or more high conductance pumping ports. Optionally, a passage of the one or more passage(s) 126 may be utilized as a gas supply port. Alternatively, the transfer chamber 104 may include two or more passages of the one or more passage(s) 126 wherein at least one passage of the one or more passage(s) 126 is utilized as a pumping port while at least one other of the one or more passage(s) may be utilized as a sensor port. One example of a transfer chamber that may be adapted to benefit from the present disclosure is an ENDURA® SL processing platform, available from Applied Materials, Inc., of Santa Clara, Calif.

The factory interface 102 generally includes an interface robot 120 and a plurality of bays 128. Each bay 128 is adapted to receive one or more of the substrate storage cassettes 105. Generally, the factory interface 102 is coupled to the load lock chamber 106 through a port 136 that is positioned opposite the bays 128. The interface robot 120 includes a blade 140 having an edge gripper or vacuum gripper used to secure the substrates 124 thereto during transfer. The interface robot 120 is generally positioned between the port 136 and bays 128 to facilitate transfer of substrates between a substrate storage cassette 105 and a load lock chamber 106.

The load lock chambers 106 (two are shown) are generally coupled between the factory interface 102 and the transfer chamber 104. The load lock chambers 106 are generally used to facilitate transfer of the substrates 124 between the vacuum environment of the transfer chamber 104 and the environment of the factory interface 102 which is typically at or near atmospheric pressure.

Each load lock chamber 106 is selectively isolated from the factory interface 102 and transfer chamber 104 by slit valves 114, 116. Generally, at least one slit valve of slit valves 114 and 116 is maintained in a closed position to prevent loss of vacuum in the transfer chamber 104. For example, the slit valve 114 may be opened while the slit valve 116 is closed to allow the interface robot 120 to transfer substrates through the port 136 between a load lock chamber 106 and a substrate storage cassette 105 disposed in the factory interface 102. After the substrate is loaded from the interface robot 120, both slit valves 114 and 116 are closed as a load lock chamber 106 is evacuated by a roughing pump (not shown) to a vacuum level substantially equal to that of the transfer chamber 104. The substrate in the evacuated load lock chamber 106 is passed into the transfer chamber 104 by opening the slit valve 116 while the slit valve 114 remains closed. Processed substrates are returned to the factory interface 102 in the reverse manner, wherein a load lock chamber 106 is vented to substantially equalize the pressure between the load lock chamber 106 and the factory interface 102. One slit valve that may be used to advantage is described in U.S. Pat. No. 5,226,632, issued Jul. 13, 1993 to Tepman et al.

The transfer chamber 104 is generally fabricated from a single piece of material such as aluminum. The transfer chamber 104 generally includes a side wall and chamber bottom that defines an interior 122 therebetween. In embodiments, the interior 122, as well as the interior cavity of the factory interface 102 is evacuable. Substrates 124 are transferred between the process chambers 108 and load lock chambers 106 coupled to the exterior of the transfer chamber 104 through a vacuum maintained within the interior 122. At least one transfer robot is disposed in the transfer chamber 104 to facilitate transfer of substrates between the process chambers 108. In the illustrative embodiment depicted in FIG. 1, a first transfer robot 112A and a second transfer robot 112B are disposed in the interior 122 of the transfer chamber 104. The transfer robots may be of the dual or single blade variety. The transfer robots typically have a "frog-leg" linkage that is commonly used to transfer substrates in vacuum environments. The first transfer robot 112A is generally disposed in an end of the transfer chamber 104 adjacent each load lock chamber 106. The second transfer robot 112B is disposed in an opposite end of the transfer chamber 104 such that each transfer robot services a subset of the process chambers 108.

One or more transfer platforms 118 are generally provided in the interior 122 of the transfer chamber 104 to facilitate substrate transfer between first transfer robots 112A and second transfer robot 112B. For example, a substrate retrieved from a load lock chamber of the one or more load lock chamber(s) 106 by the first transfer robot 112A is set down on a transfer platform of the transfer platforms 118. After the first transfer robot 112A is cleared from the transfer platform 118 supporting the substrate 124, the second transfer robot 112B retrieves the substrate from the transfer platform 118. The second transfer robot 112B may then transfer the substrate to a process chamber of the process chambers 108 serviced by the second transfer robot 112B at that end of the transfer chamber 104.

The process chambers 108 are typically bolted to an exterior side 152 of the side walls 150 of the transfer chamber 104. Examples of process chambers 108 that may be utilized are etching chambers, physical vapor deposition chambers, chemical vapor deposition chambers, ion implantation chambers, lithography chambers and the like. Process chambers 108 configured according to different recipes may be coupled to the transfer chamber 104 to provide a processing sequence appropriate to form a predefined structure or feature upon the substrate's surface. An aperture (not shown) is disposed in the side wall between each process chamber 108 (or other chamber) to allow the substrate to be passed between the process chamber 108 and interior 122 of the transfer chamber 104. A slit valve 132 configure similar to the slit valves 114, 116, selectively seals each aperture to maintain isolation between the environments of the process chambers 108 and the transfer chamber 104 between substrate transfers and during processing within the process chambers 108.

A plurality of ports 134 are generally disposed in the chamber bottom 156 proximate the side walls 150. The ports 134 may be utilized for various applications, for example, sampling the environment within the interior 122, housing sensors and flowing gases such as purge gases into the transfer chamber 104. Vacuum is typically maintained in the transfer chamber 104 during chamber use since pumping the transfer chamber down to operable vacuum levels may take as long as eight hours.

For example, a cryogenic or turbo-molecular pump (not shown) may be coupled to the transfer chamber 104 through a pumping port 110 disposed on the chamber bottom 156 to maintain a predefined vacuum within the transfer chamber 104. A gate valve (not shown) may be disposed between the cryogenic pump and the transfer chamber 104 to facilitate service of the pump without loss of vacuum within the transfer chamber 104.

Figure 2:
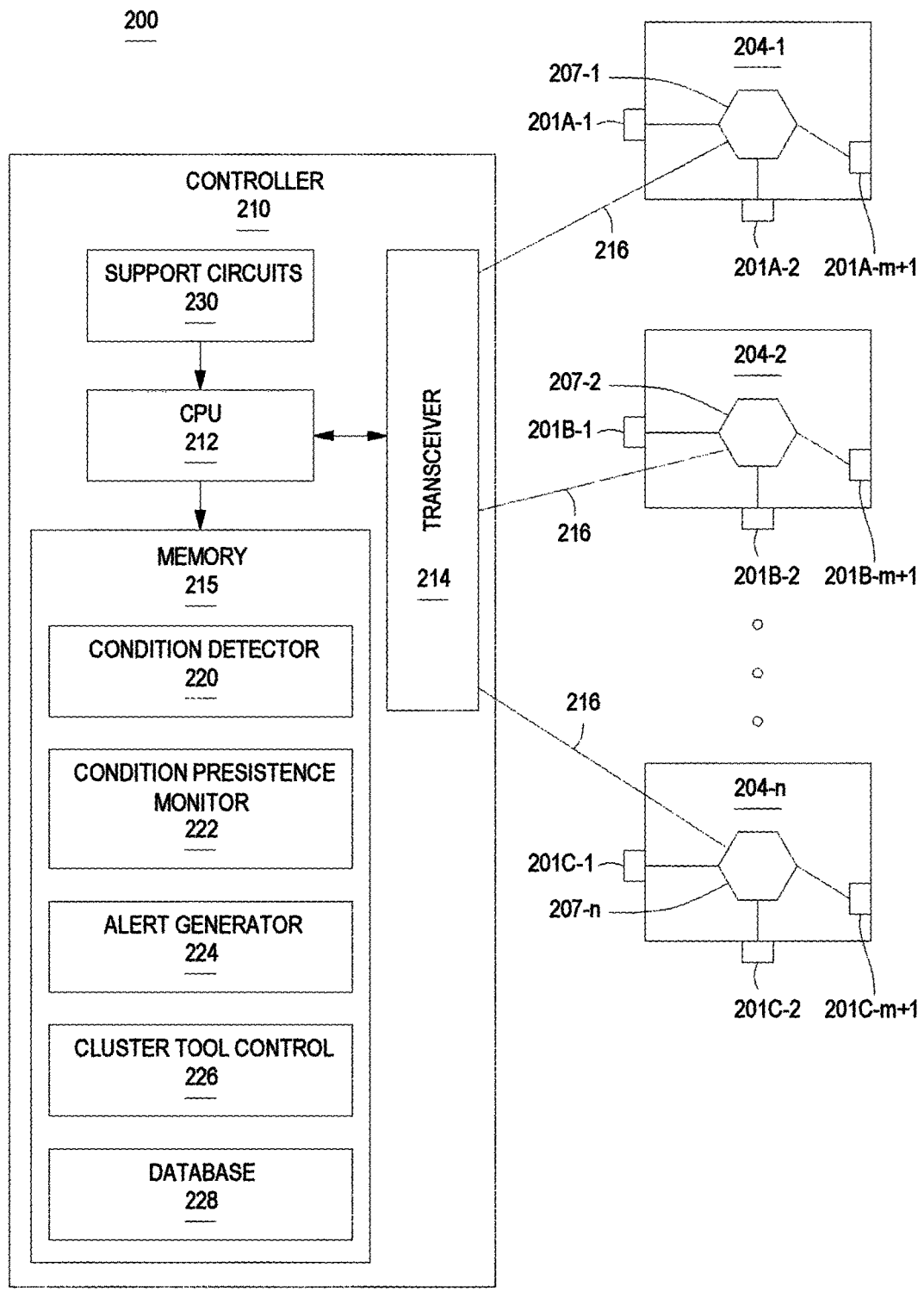
FIG. 2 is a block diagram depicting a substrate storage cassette monitoring system for detecting, monitoring and acting upon conditions determined to exist or persist, within one or more substrate storage cassettes and a factory interface of a substrate processing system such as the substrate processing system of FIG. 1, consistent with one or more embodiments of the present disclosure.

FIG. 2 is a block diagram depicting a substrate storage cassette monitoring system 200 for detecting, monitoring and acting upon conditions determined to exist or persist, within one or more substrate storage cassettes 204-1 to 204-n of a substrate processing system such as cluster tool 100 of FIG. 1, consistent with one or more embodiments of the present disclosure. In some embodiments, substrate storage cassette monitoring system 200 further includes one or more sensors positioned within and/or proximate to a factory interface (not shown) of a cluster tool (not shown).

According to some embodiments, substrate storage cassette monitoring system 200 includes a controller 210, one or more processors as CPU 212, support circuits 230 comprising input/output interfaces, peripheral devices, and the like, and one or more transceiver(s) 214 for establishing wireless and/or wireline communication links 216 either directly with one or more sensors and/or measurement devices or, as depicted in the illustrative embodiment of FIG. 2, with a corresponding master communication node, as master communication nodes 207-1 to 207-n associated with substrate storage cassettes 204-1 to 204-n, respectively.

In an embodiment, master communication node 207-1 collects real time temperature measurements and/or estimates of temperature, within the interior volume of the substrate storage cassette 204-1, from one or more temperature sensors as temperature sensor 201A-1. Master communication node 207-1 may further collect concentration level(s) of one or more airborne compounds, gases, and or particulates suspended within the interior volume of the substrate storage cassette 204-1 via one or more corresponding airborne constituent sensors 201A-2 to 201A-m (not shown). Measurements of humidity within the interior volume of the substrate storage cassette 204-1 may be further collected from a humidity sensor indicated generally at 201A-m+1.

At least some of the sensors 201A-1 to 201A-m+1 may be external to the internal volume of the substrate storage cassette 204-1. For example, in embodiments, the substrate storage cassette 204-1 may include one or more viewing window(s) aligned with a photo sensor a light source such as a laser or light emitting diode (not shown) to facilitate the observation of light scattering or absorption within the internal volume. Using such observations, such indicators of air quality as levels of airborne volatile organic compounds (VOCs), oxygen levels, and airborne metallic particulates within the interior volume of substrate storage cassette 204-1 may be measured, and the duration of time at which such levels persist may be likewise monitored and relayed to a transceiver of the one or more transceiver(s) 214 of controller 210 for appropriate processing.

In an embodiment, one or more discrete sensing elements such as thermodesorption tubes may be positioned as strips on the interior surface of a FOUP to monitor outgassing within a FOUP as a function of wafer slot. Over time, the examination of such sensing elements using gas chromatograph mass spectroscopy (GCMS) techniques may provide readings from which time of exposure inferences may be used to time the generation of operator alerts and/or alter the transfer of the applicable FOUPs and processing of any substrates disposed therein.

Each of the remaining substrate storage cassettes within a factory interface or elsewhere in substrate storage cassette monitoring system 200 may have an arrangement of sensors and/or measurement devices which is similar to, or different from the arrangement discussed above in connection with substrate storage cassette 204-1. In the example depicted in FIG. 2, each substrate storage cassette as substrate storage cassettes 204-2 to 204-n has an identical configuration to substrate storage cassette 204-1 described above. Thus, substrate storage cassette 204-2 includes sensors 201B-1 to 201B-m+1 and substrate storage cassette 204-n includes sensors 201C-1 to 201C-m+1, with each performing the same functions as those discussed above.

CPU 212 of controller 210 executes instructions stored in memory 215 as, for example, those corresponding to an operating system (not shown), a condition detector 220, a condition persistence monitor 222, an alert generator 224, cluster tool control 226, and a database 228 for storing sensor measurements over time. Substrate storage cassette monitoring system 200 may further include one or more displays (not shown) for displaying real-time measurements collected via condition detector 220, time at threshold alarm indications and/or safe-to-handle a storage cassette notifications generated by alert generator 224 in response to monitoring performed by condition persistence monitor 222, as well as other alerts such as particulate or contaminant thresholds consistent with maintaining the health and safety of human operators.

In addition to establishing communication links between the condition detector 220 of controller 210 and the various sensors and/or node controllers from which measurements are gathered, a transceiver of the one or more transceiver(s) 214 may further establish a communication link 170 with a cluster tool controller 180 (each as shown in FIG. 1). Over communication link 170, for example, control input generated by cluster tool control 226 may be used to override a planned operation of the cluster tool 100 involving one or more of the substrate storage cassettes 204-1 to 204-n. By way of further example, such control input from cluster tool control 226 may cause cluster tool controller 180 to initiate performance, by the cluster tool 100, of an alternate operation involving the substrate storage cassette.

As seen in FIG. 1, such alternate operations may be carried out by the routing of appropriate control signals from cluster tool controller 180 to any of the cluster tools via control links 190. In an embodiment, instructions for alternate operation of one or more tools of the cluster tool 100 are stored in memory 215 and executable by the CPU 212 to generate instructions for the cluster tool 100 to purge the interior volume of a substrate storage cassette and/or factory interface 102 of the cluster tool 100 with an inert gas before transferring substrates from a processing chamber 108 of the cluster tool 100 to the interior volume of one or more substrate storage cassette(s). In addition, or by way of alternative, instructions for alternate operation stored in memory 215 may be executable by the CPU 212 to generate instructions for the cluster tool 100 to suspend the transfer of substrates from the interior volume of one or more substrate storage cassettes into a processing chamber 108 of the cluster tool 100.

The links between the cluster tool controller 180, sensor monitoring system 160, and processing chambers 108 of cluster tool 100 may comprise links which connect computers (or devices) by wire, cable, fiber optic and/or wireless links as facilitated by various types of well-known network elements, such as hubs, switches, routers, and the like. The resulting network may form a Local Area Network (LAN) using various communications infrastructure, such as Ethernet, Wi-Fi, a personal area network (PAN), a wireless PAN, Bluetooth, Near field communication, and the like.

A transceiver of the one or more transceiver(s) 214 may comprise, for example, multiple transmission and receiving devices as transceivers compliant with corresponding transport or transmission protocol(s) such as IEEE 802.11, IEEE 802.13, BLUETOOTH, and/or cellular transmission protocols such as Code Division Multiple Access (CDMA), Time Division Multiple Access (TDMA) and/or Global System for Mobile communications (GSM). In embodiments, a communication session module (not shown) is configured, by execution of instructions by a processor, to perform functions of a SIP (Session Initiation Protocol) Proxy/Registrar, for transmitting alerts to the workstations of one or more designated operator(s) of cluster tool 100. In addition or alternatively, the communication session module in some embodiments of substrate storage cassette monitoring system 200 may be configured, by execution of instructions by a processor as CPU 212, to forward a telephone call or to send an SMS, MMS or IM chat message to one or designated recipients via a communications network.

Figure 3:
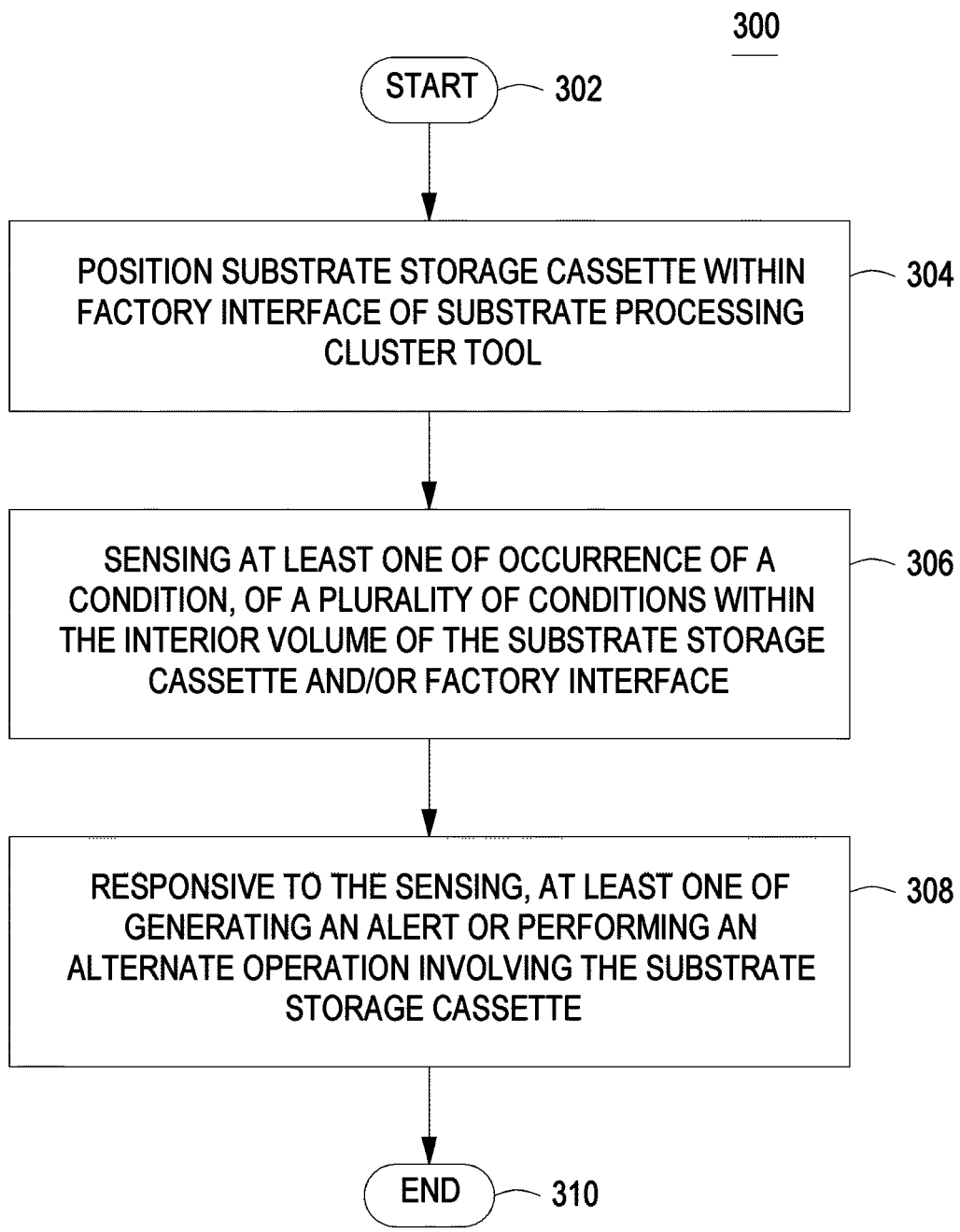
FIG. 3 is a flow diagram of a method for operating a substrate processing cluster tool such as the cluster tool exemplified by FIG. 1.

FIG. 3 is a flow diagram of a method 300 for operating a substrate processing cluster tool such as the cluster tool 100 of FIG. 1. The method 300 is entered at start block 302 and proceeds to 304. At 304, the method positions a substrate storage cassette within a factory interface of a substrate processing cluster tool, the substrate storage cassette defining an interior volume dimensioned and arranged to receive one or more substrates. The method 300 proceeds to 306, where the method 300 senses, by execution of stored instructions by a processor operatively associated with a plurality of sensors, the occurrence of a condition or a plurality of conditions within the interior volume or the persistence (e.g. for an interval of predetermined duration or beyond an elapsed time threshold) of a condition of the plurality of conditions within the interior volume.

In some embodiments, the sensing performed at 306 comprises sensing the temperature within the interior volume of the substrate storage cassette. In one or more embodiments, real time temperature measurements are recorded and/or displayed responsive to the temperature sensing. In an embodiment, an alert is generated at 308 responsive to a sensed temperature exceeding a selected temperature threshold or a temperature persistence threshold. In another embodiment, a substrate storage cassette safe-to-handle alert is generated at 308 and visually and/or audibly reproduced based on the sensed temperature to notify an operator that a particular substrate storage cassette is safe to handle (e.g., when the temperature sensed at 306 is at or below a predetermined temperature threshold).

In one or more embodiments, the sensing performed at 306 comprises at measuring and/or displaying an elapsed time between termination of a first process involving the substrate storage cassette and initiation of a second process involving the substrate storage cassette. In an embodiment, an alert comprising, for example, a visible elapsed time display or an audible elapsed time exceeded indication, is generated at 308 when the elapsed time exceeds a predetermined threshold. By way of example, a persistent delay between operations may be deemed to correlate to an environmental condition giving rise to cross contamination between the tool(s) associated with the upstream process (e.g., a first processing chamber) and the tool(s) associated with a downstream process (e.g., a second processing chamber). Alternatively, such a persistent delay may give rise to an inference that a concentration of airborne contaminants within the interior volume of a substrate storage cassette has reached a threshold which is potentially injurious to those responsible for servicing or maintaining the substrate storage cassette.

In one or more embodiments, the sensing performed at 306 may further or alternatively comprise operating a light source aligned and an optical sensor to at measure and/or monitor a concentration of one or more airborne contaminants within the substrate storage cassette and/or the factory interface of a cluster tool. In an embodiment, the sensing may comprise operating an airborne constituent sensor to monitor airborne volatile organic compounds (VOCs), oxygen levels, and/or airborne metallic particulates within the substrate storage cassette and/or factory interface. The airborne constituent sensor may comprise an oxygen sensor, an airborne metallic particulate sensor, and an airborne VOC sensor. In one or more embodiments, the sensing performed at 306 may further or alternatively comprise operating a humidity sensor within the interior volume of the substrate storage cassettes to monitor relative humidity within the substrate storage cassette.

Responsive to the sensing at 306, method 300 proceeds to 308 where the method 300 generates an alert as exemplified in the discussion above, and/or performs an alternate operation involving the substrate storage cassette. In an embodiment, the method 300 performs an alternative operation which comprises purging the interior volume of the substrate storage cassette within an inert gas before transferring substrates from a processing chamber of the cluster tool to the interior volume of a substrate storage cassette. In addition, or alternatively, the method 300 at 308 may suspend or prevent transfer of substrates from the interior volume of the substrate storage cassette into a processing chamber of the cluster tool. From 308, method 300 proceeds to 310 and terminates.

The embodiments of the present disclosure may be embodied as methods, apparatus, electronic devices, and/or computer program products. Accordingly, the embodiments of the present disclosure may be embodied in hardware and/or in software (including firmware, resident software, micro-code, and the like), which may be generally referred to herein as a "circuit" or "module". Furthermore, embodiments of the present disclosure may take the form of a computer program product on a computer-usable or computer-readable storage medium having computer-usable or computer-readable program code embodied in the medium for use by or in connection with an instruction execution system. In the context of the present disclosure, a computer-usable or computer-readable medium may be any medium that can contain, store, communicate, propagate, or transport the program for use by or in connection with the instruction execution system, apparatus, or device. These computer program instructions may also be stored in a computer-usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks.

The computer-usable or computer-readable medium may be, for example but not limited to, an electronic, magnetic, optical, electromagnetic, infrared, or semiconductor system, apparatus or device. More specific examples (a list) of the computer-readable medium include the following: hard disks, optical storage devices, magnetic storage devices, an electrical connection having one or more wires, a portable computer diskette, a random access memory (RAM), a read-only memory (ROM), an erasable programmable read-only memory (EPROM or Flash memory), an optical fiber, and a compact disc read-only memory (CD-ROM).

Computer program code for carrying out operations of embodiments of the present disclosure may be written in an object-oriented programming language, such as Java®, Smalltalk or C++, and the like. However, the computer program code for carrying out operations of embodiments of the present disclosure may also be written in conventional procedural programming languages, such as the "C" programming language and/or any other lower level assembler languages. The functionality of any of the program modules may also be implemented using discrete hardware components, one or more Application Specific Integrated Circuits (ASICs), or programmed Digital Signal Processors or microcontrollers.

The foregoing description, for purpose of explanation, has been described with reference to specific embodiments. However, the illustrative discussions above are not intended to be exhaustive or to limit embodiments of the disclosure to the precise forms disclosed. Many modifications and variations are possible in view of the above teachings. The embodiments were chosen and described in order to best explain the principles and practical applications of the present disclosure, to enable others skilled in the art to best utilize the disclosure and various embodiments with various modifications as may be suited to the particular use contemplated.

Figure 4:
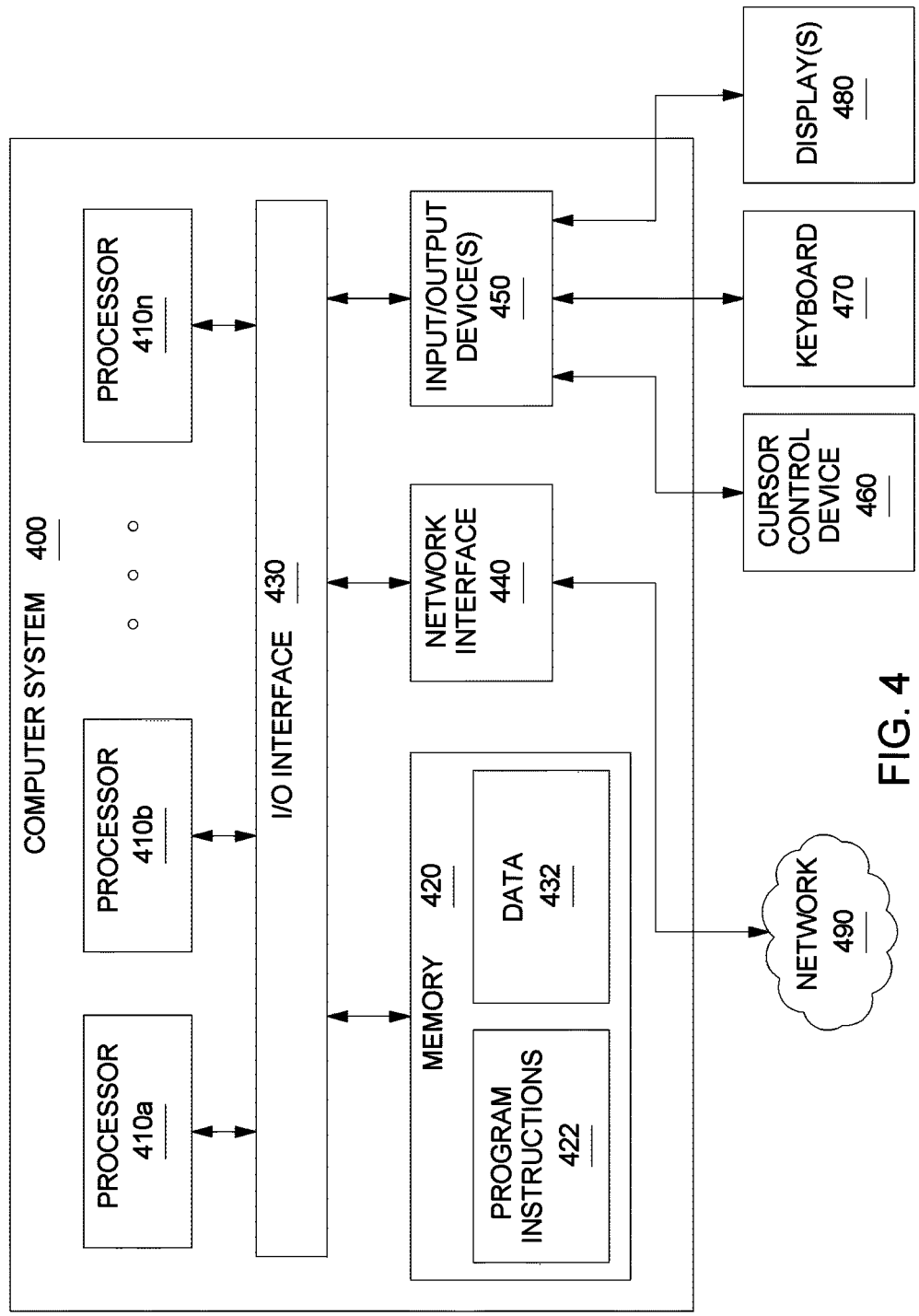
FIG. 4 is a detailed block diagram of a computer system, according to one or more embodiments, that can be utilized in various embodiments consistent with the present disclosure to implement controller(s), communication systems, and/or display devices, according to one or more embodiments.

FIG. 4 is a detailed block diagram of a computer system, according to one or more embodiments, that can be utilized in various embodiments of the present disclosure to implement the computer and/or the display devices, according to one or more embodiments.

Various embodiments of method and apparatus for organizing, enhancing and presenting message content which incorporate one or more media files, as described herein, may be executed on one or more computer systems, which may interact with various other devices. One such computer system is computer system 400 illustrated by FIG. 4, which may in various embodiments implement any of the elements or functionality illustrated in FIGS. 1-3. In various embodiments, computer system 400 may be configured to implement methods described above. The computer system 400 may be used to implement any other system, device, element, functionality or method of the above-described embodiments. In the illustrated embodiments, computer system 400 may be configured to implement method 300 (FIG. 3) as processor-executable, executable program instructions 422 (e.g., program instructions executable by at least one processor of the one or more processor(s) 410a-410n) in various embodiments.

In the illustrated embodiment, computer system 400 includes one or more processors 410a-410n coupled to a system memory 420 via an I/O (input/output) interface 430. Computer system 400 further includes a network interface 440 coupled to I/O interface 430, and one or more input/output devices 450, such as cursor control device 460, keyboard 470, and one or more display(s) 480. In various embodiments, any of the components may be utilized by the system to receive user input described above. In various embodiments, a user interface may be generated and displayed on a display of the one or more display(s) 480. In some cases, embodiments may be implemented using a single instance of computer system 400, while in other embodiments multiple such systems, or multiple nodes making up computer system 400, may be configured to host different portions or instances of various embodiments. For example, in one embodiment some elements may be implemented via one or more nodes of computer system 400 that are distinct from those nodes implementing other elements. In another example, multiple nodes may implement computer system 400 in a distributed manner.

In different embodiments, computer system 400 may be any of various types of devices, including, but not limited to, a personal computer system, desktop computer, laptop, notebook, or netbook computer, mainframe computer system, handheld computer, workstation, network computer, a mobile device such as a smartphone or PDA, an application server, storage device, a peripheral device such as a switch, modem, router, or in general any type of computing or electronic device.

In various embodiments, computer system 400 may be a uniprocessor system including a single processor, or a multiprocessor system including several additional processors (e.g., two, four, eight, or another suitable number). Each processor of the one or more processor(s) 410a-410n may be any suitable processor capable of executing instructions. For example, in various embodiments, each processor of the one or more processor(s) 410a-410n may be general-purpose or embedded processors implementing any of a variety of instruction set architectures (ISAs). In multiprocessor systems, each processor of the one or more processor(s) 410a-410n may commonly, but not necessarily, implement the same ISA.

System memory 420 may be configured to store program instructions 422 and/or data 432 accessible by a processor of the one or more processor(s) 410a-410n. In various embodiments, system memory 420 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing any of the elements of the embodiments described above may be stored within system memory 420. In other embodiments, program instructions and/or data may be received, sent or stored upon different types of computer-accessible media or on similar media separate from system memory 420 or computer system 400.

In one embodiment, I/O interface 430 may be configured to coordinate I/O traffic between a processor of the one or more processor(s) 410a-410n, system memory 420, and any peripheral devices in the device, including network interface 440 or other peripheral interfaces, such as input/output devices 450. In some embodiments, I/O interface 430 may perform any applicable or appropriate protocol, timing or other data transformations to convert data signals from one component (e.g., system memory 420) into a format suitable for use by another component (e.g., a processor 410a of the one or more processor(s) 410a-410n). In some embodiments, I/O interface 430 may include support for devices attached through various types of peripheral buses, such as a variant of the Peripheral Component Interconnect (PCI) bus standard or the Universal Serial Bus (USB) standard, for example. In some embodiments, the function of I/O interface 430 may be split into two or more separate components, such as a north bridge and a south bridge, for example. Also, in some embodiments any of the functionality of I/O interface 430, such as an interface to system memory 420, may be incorporated directly into processor 910.

Network interface 440 may be configured to allow data to be exchanged between computer system 400 and other devices attached to a network (e.g., network 490), such as one or more display devices (not shown), or one or more external systems or between nodes of computer system 400.

In various embodiments, network 490 may include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 440 may support communication via wired or wireless general data networks, such as any suitable type of Ethernet network, for example; via telecommunications/telephony networks such as analog voice networks or digital fiber communications networks; via storage area networks such as Fiber Channel SANs, or via any other suitable type of network and/or protocol.

Input/output devices 450 may, in some embodiments, include one or more communication terminals, keyboards, keypads, touchpads, scanning devices, voice or optical recognition devices, or any other devices suitable for entering or accessing data by one or more computer systems 400. Multiple input/output devices 450 may be present in computer system 900 or may be distributed on various nodes of computer system 400. In some embodiments, similar input/output devices may be separate from computer system 400 and may interact with one or more nodes of computer system 900 through a wired or wireless connection, such as over network interface 440.

In some embodiments, the illustrated computer system 400 may implement any of the methods described above, such as the method illustrated by the flowchart of FIG. 3. In other embodiments, different elements and data may be included.

Those skilled in the art will appreciate that computer system 400 is merely illustrative and is not intended to limit the scope of embodiments. In particular, the computer system and devices may include any combination of hardware or software that can perform the indicated functions of various embodiments, including computers, network devices, Internet appliances, PDAs, wireless phones, pagers, and the like. Computer system 400 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or any of the software components may execute in memory on another device and communicate with the illustrated computer system via inter-computer communication. Any of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 400 may be transmitted to computer system 400 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium or via a communication medium. In general, a computer-accessible medium may include a storage medium or memory medium such as magnetic or optical media, e.g., disk or DVD/CD-ROM, volatile or non-volatile media such as RAM (e.g., SDRAM, DDR, RDRAM, SRAM, and the like), ROM, and the like.

The methods described herein may be implemented in software, hardware, or a combination thereof, in different embodiments. In addition, the order of methods may be changed, and various elements may be added, reordered, combined, omitted or otherwise modified. The various examples described herein are presented in a non-limiting manner. Various modifications and changes may be made as would be obvious to a person skilled in the art having benefit of the present disclosure. Realizations in accordance with embodiments have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

While the foregoing is directed to embodiments of the present disclosure, other and further embodiments of the disclosure may be devised without departing from the basic scope thereof, and the scope thereof is determined by the claims that follow.

What is claimed is:

1. A method for operating a substrate processing cluster tool, comprising:
   positioning a substrate storage cassette at least partially within a factory interface of the substrate processing cluster tool, the substrate storage cassette defining an interior volume dimensioned and arranged to receive one or more substrates;
   sensing, with a plurality of sensors, at least one condition including temperature within the substrate storage cassette, an elapsed time between termination of a first process involving the substrate storage cassette and initiation of a second process involving the substrate storage cassette, a concentration of one or more airborne contaminants within at least one of the substrate storage cassette or the factory interface, or a humidity within the substrate storage cassette; and
   responsive to a sensed condition generating an alert and performing a corrective operation involving the substrate storage cassette.

2. The method of claim 1, wherein real time temperature measurements are at least one of recorded or displayed responsive to the temperature sensing.

3. The method of claim 1, wherein the alert is generated responsive to a sensed temperature exceeding at least one of a selected temperature threshold or a temperature persistence threshold.

4. The method of claim 1, wherein the alert comprises a safe to handle state of the substrate storage cassette when a sensed temperature is below a predetermined temperature.

5. The method of claim 1, wherein the alert associated with the elapsed time is generated and comprises at least one of a visible elapsed time display or an audible elapsed time exceeded indication.

6. The method of claim 1, wherein in response to the sensing of a concentration of one or more airborne contaminants within at least one of the substrate storage cassette or the factory interface, a light source is operated to at least one of measure or monitor a concentration of one or more airborne contaminants within at least one of the substrate storage cassette or the factory interface.

7. The method of claim 1, wherein the one or more airborne contaminants include at least one of organic compounds, oxygen, or airborne metallic particulates within at least one of the substrate storage cassette or the factory interface.

8. The method of claim 1, wherein the corrective operation comprises one of purging the interior volume of the substrate storage cassette within an inert gas before transferring substrates from a processing chamber of the substrate processing cluster tool to the interior volume.

9. The method of claim 1, wherein the corrective operation comprises suspending transfer of substrates from the interior volume of the substrate storage cassette into a processing chamber of the substrate processing cluster tool.

10. A substrate processing cluster tool, comprising:
at least one tool comprising a substrate processing chamber;
a factory interface defining an interior cavity dimensioned and arranged to receive a plurality of substrate storage cassettes;
at least one substrate storage cassette disposed at least partially within the interior cavity, each substrate storage cassette defining an interior volume dimensioned and arranged to receive one or more substrates;
a plurality of sensors; and
a processor operatively associated with the plurality of sensors and a memory containing instructions executable by the processor to:
sense, using the plurality of sensors, at least one of occurrence of a condition including temperature within the substrate storage cassette, an elapsed time between termination of a first process involving the substrate storage cassette and initiation of a second process involving the substrate storage cassette, a concentration of one or more airborne contaminants within at least one of the substrate storage cassette or the factory interface, or a humidity within the substrate storage cassette; and
responsive to the sensing of an occurrence of a condition, generate an alert and perform a corrective operation involving the substrate storage cassette.

11. The substrate processing cluster tool of claim 10, wherein the memory contains instructions executable by the processor for at least one of recording and displaying real time temperature measurements responsive to the temperature sensing.

12. The substrate processing cluster tool of claim 10, wherein the instructions stored in memory and executable by the processor generate an alert responsive to the sensed temperature exceeding at least one of a selected temperature threshold or a temperature persistence threshold.

13. The substrate processing cluster tool of claim 10, wherein the instructions stored in memory and executable by the processor generate a substrate storage cassette safe-to-handle alert when the sensed temperature is below a predetermined temperature.

14. The substrate processing cluster tool of claim 10:
wherein the memory contains instructions executable by the processor for at least one of measuring and displaying an elapsed time between termination of the first process involving the at least one substrate storage cassette and initiation of the second process involving the at least one substrate storage cassette; and
wherein the alert comprises at least one of a visible elapsed time display or an audible elapsed time exceeded indication.

15. The substrate processing cluster tool of claim 10, wherein instructions for the corrective operation stored in memory are executable by the processor to purge the interior volume of the substrate storage cassette with an inert gas before transferring substrates from the substrate processing chamber to the interior volume of the at least one substrate storage cassette.

16. The substrate processing cluster tool of claim 10, wherein instructions for the corrective operation stored in memory are executable by the processor to suspend transfer of substrates from the interior volume of the at least one substrate storage cassette into the substrate processing chamber.

17. A substrate storage monitoring system for use with a substrate processing tool, comprising:
at least one substrate storage cassette dimensioned and arranged for at least partial placement within an interior cavity of a factory interface of the substrate processing tool, wherein each substrate storage cassette defines an interior volume dimensioned and arranged to receive one or more substrates;
a plurality of sensors; and
a processor operatively associated with the plurality of sensors and a memory containing instructions executable by the processor to:
sense, using the plurality of sensors, at least one occurrence of an out of tolerance condition within the interior volume; and
responsive to the sensing of an out of tolerance condition, generate an alert and perform a corrective operation involving the substrate storage cassette.

18. The substrate storage monitoring system of claim 17, wherein the plurality of sensors comprises at least one of a temperature sensor, a humidity sensor, or one or more airborne constituent sensors including at least one of an airborne metallic particulate sensor, an oxygen sensor, or a volatile organic compound sensor and conditions sensed include at least one of temperature within the substrate storage cassette, an elapsed time between termination of a first process involving the substrate storage cassette and initiation of a second process involving the substrate storage cassette, a concentration of one or more airborne contaminants within at least one of the substrate storage cassette or the factory interface, or a humidity within the substrate storage cassette.

* * * * *